United States Patent [19]

Hii et al.

[11] Patent Number: 5,875,153
[45] Date of Patent: Feb. 23, 1999

[54] INTERNAL/EXTERNAL CLOCK OPTION FOR BUILT-IN SELF TEST

[75] Inventors: Kuong Hua Hii, Singapore, Singapore; Theo J. Powell, Dallas; Danny R. Cline, Plano, both of Tex.

[73] Assignee: Texas Instruments Incorporated, Dallas, Tex.

[21] Appl. No.: 4,998

[22] Filed: Jan. 9, 1998

Related U.S. Application Data

[63] Continuation-in-part of Ser. No. 846,922, Apr. 30, 1997.
[51] Int. Cl.$^6$ .................................................... G06F 11/26
[52] U.S. Cl. ...................... 365/233; 365/201; 371/22.36; 371/22.5; 371/27.7
[58] Field of Search .................................... 365/201, 233; 371/22.36, 22.5, 27.7

[56] References Cited

U.S. PATENT DOCUMENTS 5,222,068  6/1993  Burchand ............................ 371/22.3
5,614,838  3/1997  Jaber et al. .............................. 324/765
5,732,209  3/1998  Vigil et al. .......................... 395/183.06
5,761,215  6/1998  McCarthy et al. ................... 371/22.31

*Primary Examiner*—Viet Q. Nguyen
*Attorney, Agent, or Firm*—Robby T. Holand; Carl H. Hoel; Richard L. Donaldson

[57] ABSTRACT

An internal/external clock option for built in self test is provided. In one embodiment of the present invention, a clock selection circuit (150) is provided. The clock selection circuit (150) comprises an external clock source (152) and an internal clock source (177). A first multiplexer (164) is provided and has the external clock source (152) and the internal clock source (177) as data inputs and an internal clock selection bit value (B_CLKMUXB 176) as a data select input. A second multiplexer (156) having the external clock (152) and the output of the first multiplexer as data inputs and a data select input (BCLK_EN) based on whether a self-test mode is activated (BIST_EN) and the internal clock selection bit value (B_CLKMUXB) is also provided. The external clock source (152) or internal clock source (177) is selected based on the value of the internal clock selection bit value (B_CLKMUXB 176) and whether the self test mode is activated (BIST_EN).

12 Claims, 3 Drawing Sheets

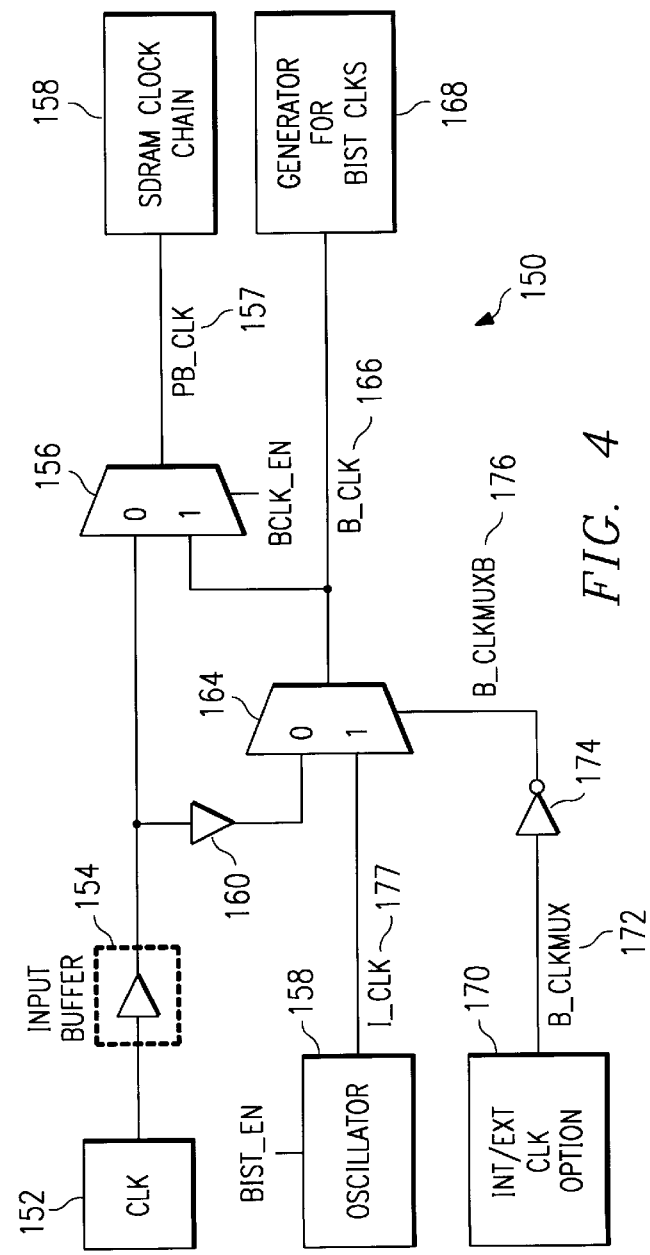

INTERNAL/EXTERNAL CLOCK OPTION FOR BUILT-IN SELF TEST

RELATED APPLICATIONS

This application is a continuation-in-part application of pending U.S. patent application Ser. No. 08/846,922, filed Apr. 30, 1997, assigned to the same party.

TECHNICAL FIELD OF THE INVENTION

This invention relates to the field of built-in self-tests for memory systems and more specifically to an internal/external clock option for built in self test.

BACKGROUND OF THE INVENTION

In conventional testing of memory device, an external tester supplies control signals such as column address (CAS), row address (RAS), write enable (WE), address signals, and data to the device under test. Outputs from the device under test are sampled by the tester to determine whether the device passes or fails. As memory device density increases, testing time also increases. This increased testing time increases the manufacturing cost of integrated circuit memory devices.

In order to decrease the time it takes to test high density memory devices, parallel read and write schemes have been implemented. One drawback of implemented parallel read and write schemes is that an external tester is required. Also, parallel leads required to test the memory devices in parallel occasionally fail due to cross talk among the leads.

To avoid the drawbacks of parallel read and write schemes, built-in self-test arrangements have been used. The built-in self-test arrangement includes a read only memory that stores test algorithm instructions. The read only memory eliminates the need for external testers as well as parallel leads. Usually it is advantageous to perform built-in self-tests using an internal clock in order to prevent cross talk when memory chips are tested in parallel. However, there are other times when it is necessary to utilize an external clock to synchronize test results with the tester or for some other reasons. Therefore, it is desirable to provide for selecting an internal clock or an external clock.

SUMMARY OF THE INVENTION

Accordingly, it may be appreciated that a need has arisen for an internal/external clock option for built in self test. In accordance with the present invention, an internal/external clock option for built in self test is provided which substantially eliminates or reduces disadvantages and problems associated with current self-test arrangements.

In one embodiment of the present invention a clock selection circuit is provided. The clock selection circuit comprises an external clock source and an internal clock source. A first multiplexer is provided and has the external clocking source and the internal clock source as data inputs and an internal clock selection bit value as a data select input. A second multiplexer has the external clocking signal and the output of the first multiplexer as data inputs and a data select input based on whether a self-test mode is activated and the internal clock selection bit value. The external clock or internal clock is selected based on the value of the internal clock selection bit value and whether the self test mode is activated.

The present invention provides various technical advantages over current mask release number storage. For example one technical advantage is that clock selection can be easily made. Another technical advantage is a simple selection circuit for choosing between an internal or external clock is provided. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, in which:

FIG. 3 illustrates the bit register of the enable test circuit; and,

FIG. 4 is a circuit overview of the internal/external clock option

DETAILED DESCRIPTION OF THE INVENTION

Figure 1:
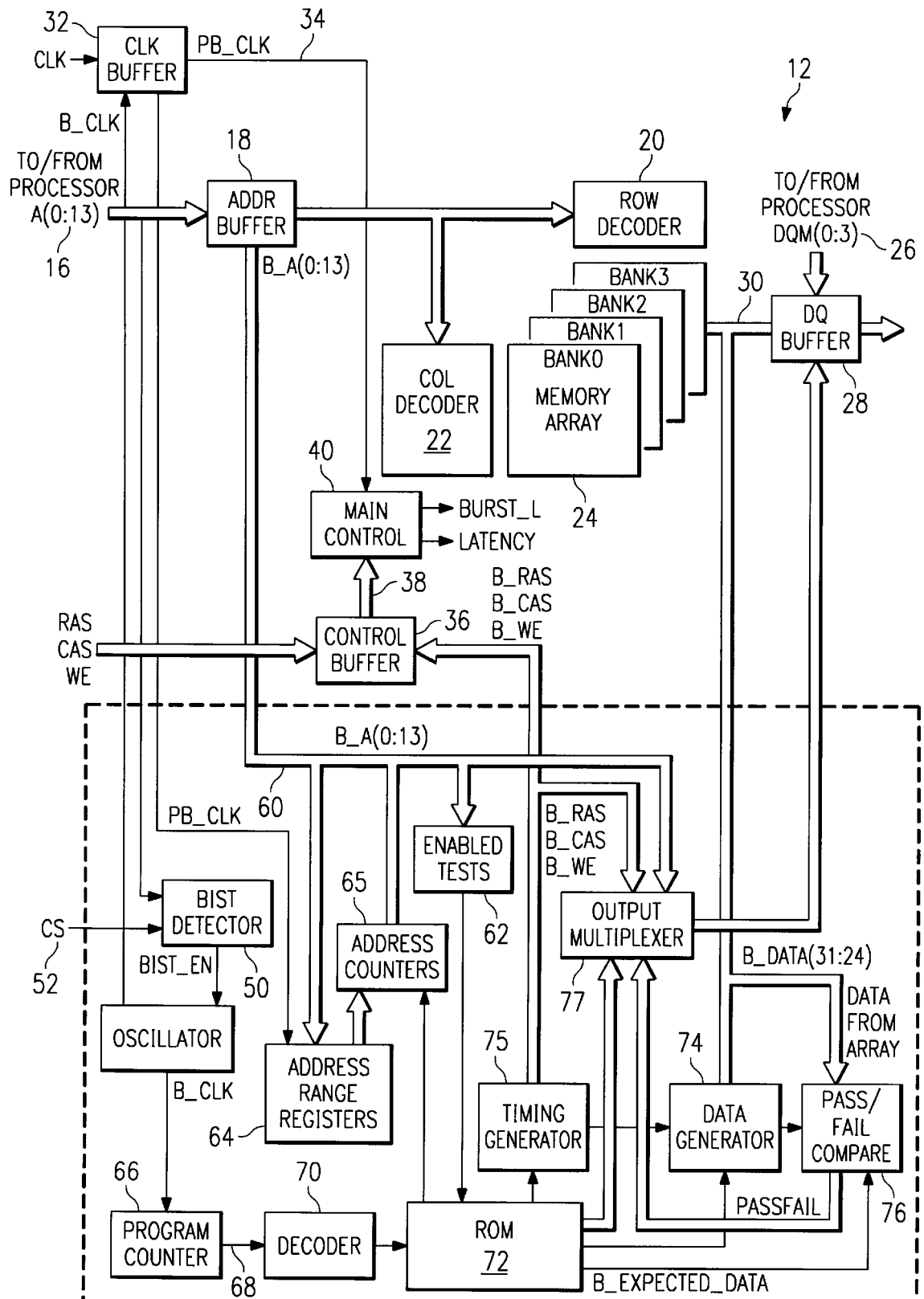
FIG. 1 illustrates a synchronous dynamic random access memory (SDRAM) with a built-in self-test.

FIG. 1 illustrates a synchronous dynamic random access memory (SDRAM) 10 with built-in self-test device 10 in accordance with the teachings of the present invention. SDRAM 10 comprises a conventional memory 12 and a built-in self-test arrangement 14.

Conventional memory 12, in one embodiment, operates as a conventional synchronous dynamic random access memory during normal operation. In test operations, built-in self-test arrangement 14 operates in a self-test mode. All test signals are generated internally to SDRAM 10.

In normal mode, conventional memory 12 operates like a well-known synchronous dynamic random access memory device. A digital processor, such as a microprocessor (not shown) produces row and column address. The row and column addresses are provided on an address bus 16 in a time division multiplexed format for storage in an address buffer 18. After receiving a control signal from the digital processor, the row address and column address are decoded either by row decoder 20 or column decoder 22.

Depending upon the state of the write enable signal, WE, from the digital processor, data is either written into or read out from storage cells located in the banks of a memory array 24. Data which is written into memory array 24 is entered by way of data bus 26. In-coming data is buffered in a data buffer 28 and forwarded to memory array 24 by an internal data bus 30 where it is stored until it is written over or not properly refreshed. Data stored in memory array 24 can be addressed and read out of memory array 24 via internal data bus 30 and data buffer 28 to data bus 26. Typically, data bus 26 is connected to the data receiving and sending terminals of a digital processor such as a microprocessor.

Conventional memory 12, in one embodiment, is a synchronous dynamic random access memory and therefore relies on a system clock for synchronizing its operation with the digital processor, peripheral devices, and control circuitry connected to SDRAM 10. A clock signal CLK is applied to a clock buffer 32 which outputs an internal clock signal 34 for operating memory array 24 during normal operation.

The digital processor applies control signals CAS, RAS, and WE to a control signal buffer 36. During normal operation, these control signals pass through control buffer 36, over to a control bus 38 to a main control unit 40 or for access to memory array 24 through row decoder 20 and column decoder 22. During normal operations, internal system clock signal 34 and the control signals control operation of memory array 24.

The self-test mode is entered if special signal conditions are applied at power up of SDRAM 10. Typically, to initiate the self-test mode, a DC signal will be applied externally to SDRAM 10. In one example, an overvoltage signal to a specific address pin (such as pin A4) of SDRAM 10 would place SDRAM 10 in a self-test condition. Once an overvoltage is applied to a specific pin, a built-in self-test detector circuit 50 responds to this overvoltage by placing built-in self-test arrangement 14 into the self-test mode.

In the self-test mode, built-in self-test arrangement 14 prepares for testing by gathering information on what test to run. The self-test mode is exited when another input is applied to an address lead. In one embodiment, that input applies a high level to control signal 52 (CS) at built-in self-test detector circuit 50. In this embodiment, the self-test mode will be active as long as control signal 52 remains at a high level state. Once control signal 52 falls to a low level state, the self-test mode is exited. Further description of the arrangement and operation of built-in self-test detector 50 can be found in copending U.S. application Ser. No. 08/840,428, hereby incorporated by reference herein.

Upon entering the self-test mode, built-in self-test detector 50 sends a BIST_EN signal to an oscillator 58. In response to the BIST_EN signal, oscillator 58 generates a clock signal B_CLK that is applied to a clock buffer 32 in order to take control of clock buffer 32. Alternatively, an external clock scheme may be used.

When in the self-test mode, data from address buffer 18 is transferred via internal address bus 60 to an enabled test circuit 62. Enabled test circuit 62 is a shift register that stores data identifying a specific test, or group of tests, to be run during the self-test mode. Once the selected test data is stored in enabled test circuit 62, a group of addresses may be stored in an address range register 64. Additionally, enabled test circuit 62 can store data indicating if the internal or external clock is to be used. Further details of enable test circuit 62 can be found in copending U.S. application Ser. No. 09/005,081which is hereby incorporated by reference herein. Address data can then be tracked using address counter 65.

Also included is a program counter 66 operable to control test sequences. Upon initiation of self-test mode, program counter 66 is reset to its zero state by clock signal B_CLK. Program counter 66 is a sequential logic arrangement in which the next state of program counter 66 is determined by a current state of program counter 66 and the state of data furnished by a Read-only-Memory (ROM) register.

A Read only Memory decoder 70 receives binary signals from program counter 66 via a bus 68. The binary signals are decoded by ROM address decoder 70. In one embodiment, a one out of sixty-four code technique is used to select a row of data from a read only memory 72. In one embodiment, ROM 72 is a sixty-four row read only memory that stores sequences of instruction for controlling routines. In one embodiment, ten test algorithms are stored in ROM 72. Each row address applied form ROM address decoder 70 to ROM 72 accesses a row of data stored therein in response to clock signal B_CLK. One row of data typically makes up one instruction of an algorithm. It is in one of these instructions that a mask release number for SDRAM 10 is stored.

Instructions are outputted from ROM 72 to a data generator 74 which generates the data to be written to or read from memory array 24. A pass/fail circuit 76 compares the data from memory array 24 with the expected data from ROM 72 and data generator 74. When expected data is equivalent to the data from memory array 24, a pass signal is generated. If not, a fail signal is generated. Fail signals are stored in a register (not pictured) and conveyed through data buffer 28 where the results can be read off a pin of SDRAM 10.

Additionally, instructions from ROM 72 are received by timing generator 75 which generates self-test signals such as B_RAS, B_CAS and B_WE, which are the internally generated equivalent of RAS, CAS, and WE. B_CAS, B_RAS and B_WE instructions pass to control signal buffer 36 when in self-test mode. Output multiplexer 77 takes data involving DRAM addresses, control signals, clock information, and data from pass/fail circuit 76 and presents it to DQ buffer 28.

Figure 2:
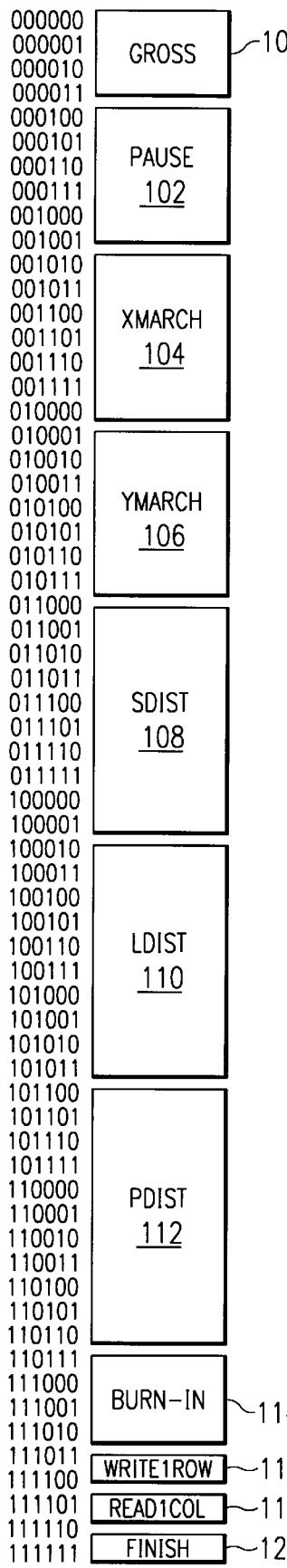
FIG. 2 illustrates read only memory addresses and the corresponding self-tests for the built-in self-test.

FIG. 2 illustrates read only memory 72 addresses and the corresponding self-tests. In the illustrated embodiment, a total of ten self-tests are provided. In this embodiment, a gross test 100 occupies ROM 72 address 000000 to 000011. Gross test 100 is a write and read test from a full array. A pause test 102 occupies address 000100 to 001000. Pause test 102 tests for data retention. An Xmarch test 104 occupies address 001010 to 010000. Xmarch test 104 writes to one column at a time until the entire memory array 24 is filed. A Ymarch test 106 occupies address 010001 to 010111. Ymarch test 106 writes to one row at a time until the entire memory array 24 is filed. A short disturb test 108 occupies address 011000 to 100001 . Short disturb test 108 tests adjacent rows using a disturb algorithm having short cycle timing. A long disturb 110 occupies address 100010 to 101011. Long disturb test 110 tests adjacent rows using a disturb algorithm having long cycle timing. A page disturb test 112 occupies address 101100 to 110110. Page disturb test 112 tests adjacent rows in a page mode. A burn in test 114 occupies addresses 110111 to 111010. Burn in test 114 does a full array burn in. Further details of burn in test 114 can be found in copending U.S. application Ser. No. 09/004,973 which is hereby incorporated by reference herein. A write one row test 116 occupies address 111011 to 111100. This test writes to one row. A read one column test 118 occupies address 111101 to 111110. Read one column test 118 reads data from one column. Finally, address 111111 is the end of the self-tests and contains an idle instruction 120 as well as the mask release number for SDRAM device. Further details of storing mask release numbers can be found in copending U.S. application Ser. No. 09/005,359 which is hereby incorporated by reference herein.

FIG. 3 illustrates the bit register 140 of enable test circuit 62. In an exemplary embodiment, register 14 comprises fourteen address bits 142. Each address bit corresponds to a built-in self-test, as described in FIG. 2 or a built-in self-test arrangement 14 setting. For the test algorithms, a one in a bit address indicates the test is to be performed while a zero indicates the test is to be skipped. Address BA1 146 is the address for the internal/external clock enable. If a one is entered in address BA1 146, the external clock is selected. When it is a zero, the internal clock is selected.

FIG. 4 is a circuit overview of the internal/external clock option. Clock circuit 150 is typically in one of three modes. SDRAM 10 can be in normal mode with external clocking used. Alternatively, SDRAM 10 can be in self-test mode with external clocking or SDRAM 10 can be in self-test mode with internal clocking.

If SDRAM 10 is in normal mode, external clock 152 will supply a buffer 154. BIST_EN, which is based on the condition of self test circuit 50, will be zero since built-in self-test is not enabled. Therefore, oscillator 58 is not activated. Since external clocking is chosen, a one will occupy address BA1 146 of enable test circuit 62. signal B_CLKMUX 172 is the value of address BA1 146, so it is a one in this case. After passing through an inverter 174, signal B_CLKMUXB is 0. Therefore, the data inputs to a first multiplexer 164 are the external clock signal 152 and the output of oscillator 58, which, in this case, is not activated. The data select input is signal B_CLKMUXB 176, which is zero in this case. Therefore, external clock signal passes through first multiplexer 164. The data inputs to second multiplexer 156 are both the external clock signal. The data select input to second multiplexer 156 is signal BCLK_EN. Signal BCLK_EN is based on the value of signal B_CLKMUX and signal BIST_EN. Signal BCLK_EN is one when signal B_CLKMUX is zero and signal BIST_EN is one, otherwise, signal BCLK_EN is zero. Therefore, signal BCLK_EN is zero in this case. Thus, the first external clock signal is chosen and it forms signal PB_CLK 157 which feeds SDRAM clock chain 158.

If SDRAM 10 is in self-test mode with external clocking, external clock 152 will supply buffer 154. Signal BIST_EN, which is based on the condition of self test circuit 50, will be one since built-in self-test is enabled. Therefore, oscillator 58 is activated and generates a clocking signal. Since external clocking is chosen, a one will occupy address BA1 146 of enable test circuit 62. Signal B_CLKMUX 172 is the value of address BA1 146, so it is a one in this case. After passing through an inverter 174, signal B_CLKMUXB is 0. Therefore, the data inputs to a first multiplexer 164 are the external clock signal 152 and the output of oscillator 58. The data select input is signal B_CLKMUXB 176, which is zero in this case. Therefore the first data input, external clock 152 passes through first multiplexer and forms signal B_CLK 166. Since self-test mode is active, a generator 168 is active and receives signal B_CLK 166. Generator 168 then generates other signals such as B_RAS, B_CAS, and B_WE.

The data inputs to second multiplexer 156 are external clock 152 and signal B_CLK 166 generated by the external clock 152. The data select input to second multiplexer 156 is signal BCLK_EN. Signal BCLK_EN is based on the value of signal B_CLKMUX and signal BIST_EN. Signal BCLK_EN is one when signal B_CLKMUX is zero and signal BIST_EN is one, otherwise signal BCLK_EN is zero. Therefore, signal BCLK_EN is zero in this case. Thus, the first external clock signal is chosen and it forms signal PB_CLK 157 which feeds SDRAM clock chain 158.

If SDRAM 10 is in self-test mode with internal clocking, external clock 152 will supply a buffer 154. Signal BIST_EN, which is based on the condition of self test circuit 50, will be one since built-in self-test is enabled. Therefore, oscillator 58 is activated and generates an internal clocking (I_CLK) 177. Since internal clocking is chosen, a zero will occupy address BA1 146 of enable test circuit 62. Signal B_CLKMUX 172 is the value of address BA1 146, so it is a zero in this case. After passing through an inverter 174, signal B_CLKMUXB is one. Therefore, the data inputs to a first multiplexer 164 are external clock signal 152 and internal clock signal I_CLK 177. The data select input is signal B_CLKMUXB 176, which is one in this case. Therefore the second data input, internal clock signal, I_CLK 177, from oscillator 58 passes through first multiplexer and forms signal B_CLK 166. Since self-test mode is active, generator 168 is active and receives signal B_CLK 166. Generator 168 then generates other signals such as B_RAS, B_CAS and B_WE.

The data inputs to second multiplexer 156 are external clock 152 and signal B_CLK 166 generated by internal oscillator 58. The data select input to second multiplexer 156 is signal BCLK_EN. Signal BCLK_EN is based on the value of signal B_CLKMUX and signal BIST_EN. Signal BCLK_EN is one when signal B_CLKMUX is zero and signal BIST_EN is one, otherwise signal BCLK_EN is zero. Therefore, signal BCLK_EN is one in this case. Thus, signal B_CLK generated by internal oscillator 58 is chosen and it forms signal PB_CLK 157 which feeds SDRAM clock chain 158.

Thus, it is apparent that there has been provided, in accordance with the present invention, internal/external clock option for built-in self-test that satisfies the advantages set forth above. Although the present invention has been described in detail, it should be understood that various changes, substitutions, and alterations may be readily ascertainable by those skilled in the art and may be made herein without departing from the spirit and scope of the present invention as defined by the following claims.

What is claimed is:

1. A clock selection circuit comprising:
    an external clock source;
    an internal clock source;
    a first multiplexer having the external clocking source and the internal clocking source as data inputs and an internal clock selection bit value as a data select input;
    a second multiplexer having the external clocking signal and the output of the first multiplexer as data inputs and a data select input based on whether a self-test mode is activated and the internal clock selection bit value.

2. The circuit of claim 1, wherein the first multiplexer passes the external clocking source when the internal clock selection bit is set to disable the internal clock source.

3. The circuit of claim 1, wherein the first multiplexer passes the internal clock source when the internal clock selection bit is set to enable the internal clock source and the second multiplexer passes the internal clock source when the self-test mode is also activated.

4. The circuit of claim 1, further comprising a generator operable to generate internally generated control signals.

5. The circuit of claim 4, wherein the generator uses the external clock to generate control signals when the internal clock selection bit is set to disable the internal clock and the self-test mode is activated.

6. The circuit of claim 4, wherein the generator uses the internal clock to generate control signals when the internal clock selection bit is set to enable the internal clock and the self-test mode is activated.

7. A system for selecting the source of clocking signals in a memory device, comprising;
    a test enable circuit having an internal clock enable setting;
    a built-in self-test detector circuit; and
    a clock selection circuit in communication with the test enable circuit and the built in self-test circuit, wherein the clock selection circuit chooses a clock source based on the setting of the internal clock enable and the built-in self-test circuit.

8. The system of claim 7, wherein an external clock source is chosen when the setting of the internal clock enable is set to disable the internal clock.

9. The system of claim 7, wherein an internal clock source is chosen when the setting of the internal clock enable is set to enable the internal clock.

10. The system of claim 7, wherein the clock selection circuit further comprises a generator operable to generate control signals based on a clock input.

11. The system of claim 10, wherein the generator generates a control signal using an external clocking source when the setting of the internal clock selection is set to disable the internal clock and the built-in self-test circuit is set to activate a built-in self-test mode.

12. The system of claim 10, wherein the generator generates a control signal using an internal clocking source when the setting of the internal clock selection is set to enable the internal clock and the built-in self-test circuit is set to activate a built-in self-test mode.

* * * * *